United States Patent
Hussell et al.

(10) Patent No.: US 9,318,674 B2
(45) Date of Patent: Apr. 19, 2016

(54) SUBMOUNT-FREE LIGHT EMITTING DIODE (LED) COMPONENTS AND METHODS OF FABRICATING SAME

(71) Applicant: Cree, Inc., Raleigh, NC (US)

(72) Inventors: Christopher P. Hussell, Cary, NC (US); Peter S. Andrews, Durham, NC (US); Jesse C. Reiherzer, Raleigh, NC (US)

(73) Assignee: Cree, Inc., Durham, NC (US)

( * ) Notice: Subject to any disclaimer, the term of this patent is extended or adjusted under 35 U.S.C. 154(b) by 59 days.

(21) Appl. No.: 13/759,229

(22) Filed: Feb. 5, 2013

(65) Prior Publication Data
US 2014/0217436 A1    Aug. 7, 2014

(51) Int. Cl.
*H01L 33/00*  (2010.01)
*H01L 33/62*  (2010.01)
*H01L 33/48*  (2010.01)
*H01L 33/50*  (2010.01)

(52) U.S. Cl.
CPC ............... *H01L 33/62* (2013.01); *H01L 33/486* (2013.01); *H01L 33/50* (2013.01); *H01L 2224/13* (2013.01)

(58) Field of Classification Search
CPC ......... H01L 33/00; H01L 33/44; H01L 33/50; H01L 33/62
USPC ...................... 257/98, 99, 100; 438/FOR. 157
See application file for complete search history.

(56) References Cited

U.S. PATENT DOCUMENTS

| 7,166,483 | B2 * | 1/2007 | Liu et al. ........................ 438/29 |
| 8,368,100 | B2 | 2/2013 | Donofrio et al. |
| 2002/0187571 | A1 * | 12/2002 | Collins et al. .................. 438/29 |
| 2005/0194605 | A1 * | 9/2005 | Shelton et al. ................... 257/99 |
| 2006/0006404 | A1 * | 1/2006 | Ibbetson ............... H01L 23/481 257/99 |
| 2010/0200870 | A1 | 8/2010 | Shen |
| 2010/0207157 | A1 | 8/2010 | Schiaffino et al. |
| 2011/0012164 | A1 * | 1/2011 | Kim ................................ 257/99 |
| 2011/0127568 | A1 | 6/2011 | Donofrio et al. |
| 2011/0147779 | A1 | 6/2011 | Kang et al. |
| 2012/0012889 | A1 * | 1/2012 | Okabe et al. ..................... 257/99 |
| 2012/0034717 | A1 * | 2/2012 | Colvin et al. ................... 438/27 |
| 2012/0132949 | A1 * | 5/2012 | Watari et al. .................... 257/99 |
| 2012/0193649 | A1 * | 8/2012 | Donofrio et al. ............... 257/88 |
| 2012/0193660 | A1 * | 8/2012 | Donofrio et al. ............... 257/98 |
| 2012/0193661 | A1 | 8/2012 | Emerson et al. |

(Continued)

FOREIGN PATENT DOCUMENTS

DE    10 2008 010 512 A1    8/2009
EP        2 393 131 A1    12/2011

(Continued)

OTHER PUBLICATIONS

Cree, Inc., "Direct Attach DA3547™ LEDs", Data Sheet: CPR3EL Rev. A, 2010, 5 pp.

(Continued)

*Primary Examiner* — Matthew Landau
*Assistant Examiner* — Eric Ashbahian
(74) *Attorney, Agent, or Firm* — Myers Bigel & Sibley, P.A.

(57) ABSTRACT

Light emitting devices include a Light Emitting Diode (LED) chip having an anode contact and a cathode contact on a face thereof. A solder mask extends from the gap between the contacts onto one or both of the contacts. The LED chip may be mounted on a printed circuit board without an intervening submount. Related fabrication methods are also described.

31 Claims, 11 Drawing Sheets

(56) References Cited

U.S. PATENT DOCUMENTS

| | | | |
|---|---|---|---|
| 2012/0205697 A1 | 8/2012 | Kim et al. | |
| 2012/0267649 A1 | 10/2012 | Shen | |
| 2012/0302124 A1* | 11/2012 | Imazu | 445/58 |
| 2012/0305939 A1 | 12/2012 | Slater, Jr. et al. | |
| 2012/0326171 A1* | 12/2012 | Lee et al. | 257/88 |
| 2013/0328073 A1 | 12/2013 | Lowes et al. | |
| 2013/0329425 A1 | 12/2013 | Lowes et al. | |
| 2014/0077235 A1* | 3/2014 | Kwon et al. | 257/88 |

FOREIGN PATENT DOCUMENTS

| | | |
|---|---|---|
| JP | 2000-196197 A | 7/2000 |
| WO | WO 2005/029599 A2 | 3/2005 |
| WO | WO 2005/081319 A1 | 9/2005 |

OTHER PUBLICATIONS

Cree, Inc., "*Direct Attach DA700™ LEDs*", Data Sheet: CPR3EU Rev. -, 2011, 5 pp.

Cree, Inc., "*Direct Attach DA1000™ LEDs*", Data Sheet: CPR3ES Rev. A, 2010, 5 pp.

International Search Report and Written Opinion of the International Searching Authority, PCT Application No. PCT/US2014/012280, Jun. 23, 2014.

Invitation to Pay Additional Fees and, Where Applicable, Protest Fee, PCT Application No. PCT/US2014/012707, May 12, 2014.

International Search Report and Written Opinion of the International Searching Authority, PCT Application No. PCT/US2014/012707, Aug. 11, 2014.

Communication With Supplementary European Search Report, European Application No. 14749368.8, Jan. 15, 2016.

* cited by examiner

SUBMOUNT-FREE LIGHT EMITTING DIODE (LED) COMPONENTS AND METHODS OF FABRICATING SAME

BACKGROUND

This invention relates to light emitting devices and assemblies and methods of manufacturing the same, and more particularly, to Light Emitting Diodes (LEDs) and assemblies thereof.

LEDs are widely known solid-state lighting elements that are capable of generating light upon application of voltage thereto. LEDs generally include a diode region having first and second opposing faces, and include therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials. Finally, the light radiated by the LED may be in the visible or ultraviolet (UV) regions, and the LED may incorporate wavelength conversion material such as phosphor.

LEDs are increasingly being used in lighting/illumination applications, with a goal being to provide a replacement for the ubiquitous incandescent light bulb.

SUMMARY

Light emitting devices according to various embodiments described herein include a Light Emitting Diode (LED) chip having first and second opposing faces and an anode contact and a cathode contact that are spaced apart from one another on the first face to define a gap therebetween, the anode and cathode contacts having outer faces that are remote from the first face. A solder mask extends from the gap onto the outer face of the anode contact and/or the outer face of the cathode contact.

In some embodiments, the outer faces of the anode and cathode contacts are approximately coplanar. Moreover, in some embodiments, the solder mask on the outer face of the anode contact and/or the outer face of the cathode contact protrudes from the first face of the LED chip beyond the outer faces of the anode and cathode contacts. Moreover, in other embodiments, the solder mask exposes at least a portion of the outer faces of the anode and the cathode contacts to define a second gap between the outer faces of the anode and cathode contacts that are exposed by the solder mask, that is wider than the gap between the anode and the cathode contacts. In other embodiments, the cathode contact is wider than the anode contact and the solder mask extends from the gap onto the outer face of the cathode contact, but does not extend onto the outer face of the anode contact. In still other embodiments, the anode contact is wider than the cathode contact.

In still other embodiments, an anode contact extension and a cathode contact extension are provided on the respective outer faces of the anode and cathode contacts that are exposed by the solder mask. Moreover, in some embodiments, the outer faces of the anode contact extension, the cathode contact extension and the solder mask are approximately coplanar.

Any of the above embodiments may also include a first solder layer on the outer face of the anode contact (or contact extension) and a second solder layer on the outer face of the cathode contact (or contact extension) that are spaced apart from one another by the solder mask that extends onto the outer face of the anode contact (or contact extension) and/or the cathode contact (or contact extension).

Moreover, in any of the above embodiments, a phosphor layer also may be provided on the second face of the LED chip. A transparent layer that is free of phosphor may also be provided on the phosphor layer remote from the second face and/or directly on the second face. In some embodiments, the phosphor layer may also extend on a sidewall of the LED chip that is between the first and second faces. In other embodiments, the phosphor layer comprises phosphor particles that are non-uniformly dispersed therein.

Light emitting devices according to various other embodiments described herein comprise an LED chip including a substrate having first and second opposing substrate faces and a diode region on the first substrate face. The LED chip is configured to electrically connect the diode region to a printed circuit board so that the diode region faces the printed circuit board without an intervening submount between the diode region and the printed circuit board. Moreover, the light emitting device may be provided in combination with the printed circuit board, wherein the diode region faces the printed circuit board and is connected to the printed circuit board without an intervening submount between the diode region and the printed circuit board.

In some embodiments, the printed circuit board includes a connection surface, and the diode region is spaced apart from the connection surface by less than about 200 μm in some embodiments, by less than about 150 μm in other embodiments, and by less than about 100 μm in still other embodiments. Moreover, in some embodiments, the LED chip further comprises an anode contact on the diode region remote from the substrate and a cathode contact on the diode region remote from the substrate and spaced apart from the anode contact, and the printed circuit board comprises an anode pad and a cathode pad. In these embodiments, the light emitting device may further comprise a solder layer that directly connects the anode contact to the anode pad and that also directly connects the cathode contact to the cathode pad.

A light emitting device may be fabricated according to various embodiments described herein by providing an LED chip having first and second opposing faces and an anode contact and a cathode contact that are spaced apart from one another on the first face to define a gap therebetween, and by forming a solder mask that extends from the gap onto the outer face of the anode contact and/or the outer face of the cathode contact. In some embodiments, the outer faces of the anode and cathode contacts are soldered to a printed circuit board. In other embodiments, the LED chip is placed on a receiving surface, such as a tape, such that the outer faces of the anode contact, the cathode contact and the solder mask face the receiving surface. A phosphor layer may be formed on a second face of the LED chip that is placed on the receiving surface and a transparent layer that is free of phosphor may be formed on the phosphor layer. In some embodiments, the phosphor layer comprises phosphor particles that are non-uniformly dispersed therein. The receiving surface may then be removed from the LED chip having the phosphor layer thereon, and the outer faces of the anode and cathode contacts may be soldered to a printed circuit board.

Any of the above method embodiments may further comprise forming an anode contact extension and a cathode contact extension on the respective outer faces of the anode and cathode contacts that are exposed by the solder mask, and soldering outer faces of the anode and cathode contact extensions to a printed circuit board.

Light emitting devices may be fabricated, according to other embodiments described herein, by providing an LED chip including a substrate having first and second opposing substrate faces and a diode region on the first substrate face, and placing the LED chip on a receiving surface, such as a tape, such that the diode region faces the receiving surface without an intervening submount between the diode region and the tape. A phosphor layer is formed on the LED chip that is on the receiving surface, and the LED chip having the phosphor layer thereon is removed from the receiving surface. The LED chip that has been removed from the receiving surface is then soldered to a printed circuit board, such that the diode region faces the printed circuit board and is connected to the printed circuit board without an intervening submount between the diode region and the printed circuit board. Moreover, prior to and/or after removing the LED chip, a transparent layer that is free of phosphor may be formed on the phosphor layer. In any of these embodiments, the phosphor layer and/or the transparent layer may be formed on the LED chip and on the receiving surface beyond the LED chip. Moreover, the phosphor layer may comprise phosphor particles that are non-uniformly dispersed therein.

DETAILED DESCRIPTION

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Some embodiments now will be described generally with reference to gallium nitride (GaN)-based light emitting diodes on silicon carbide (SiC)-based growth substrates for ease of understanding the description herein. However, it will be understood by those having skill in the art that other embodiments of the present invention may be based on a variety of different combinations of growth substrate and epitaxial layers. For example, combinations can include AlGaInP diodes on GaP growth substrates; InGaAs diodes on GaAs growth substrates; AlGaAs diodes on GaAs growth substrates; SiC diodes on SiC or sapphire ($Al_2O_3$) growth substrates and/or a Group III-nitride-based diode on gallium nitride, silicon, silicon carbide, aluminum nitride, sapphire, zinc oxide and/or other growth substrates. Moreover, in other embodiments, a growth substrate may not be present in the finished product. For example, the growth substrate may be removed after forming the light emitting diode, and/or a bonded substrate may be provided on the light emitting diode after removing the growth substrate. In some embodiments, the light emitting diodes may be gallium nitride-based LED devices manufactured and sold by Cree, Inc. of Durham, N.C.

Various embodiments described herein can reduce the cost, size and/or complexity of LED components by eliminating the need for a submount or interposer between an LED chip and a printed circuit board on which an LED chip is mounted. Submounts are generally used in LED devices to interpose an LED chip and a printed circuit board. The submount may change the contact configuration of the LED chip to be compatible with the pads of the printed circuit board. The submount may also be used to support a phosphor layer or an encapsulating dome that surrounds the LED chip. The submount may also provide other functionality. Thus, a submount may include a receiving element onto which an LED chip is mounted using conventional die-attach techniques, to interface the LED chip and a printed circuit board. A submount generally has a thickness of at least 100 µm, and in some embodiments at least 150 µm, and in other embodiments at least 200 µm, and generally includes traces (such as on ceramic panels) and/or leads (such as in a Plastic Leaded Chip Carrier (PLCC) package).

Various embodiments described herein may arise from a recognition that other techniques may be used to modify the contact sizes or spacing for greater compatibility with printed circuit board pads and/or other techniques may be used to provide a phosphor layer and/or a dome or other encapsulation layer on an LED chip without the need to provide a separate submount or interposer between the LED chip and the printed circuit board. For example, a solder mask may be applied to the anode and/or cathode contacts of an LED chip to increase the effective gap between the anode and cathode contacts. Moreover, LED chips that do not include a submount may be placed on a tape, coated with a phosphor layer and, optionally, also coated with a transparent layer that is free of phosphor, removed from the tape and then soldered to a printed circuit board without the need for an intervening submount. Other techniques may also be used to provide submount-free LED components and methods of manufacturing the same, according to various embodiments described herein.

Figure 1A:
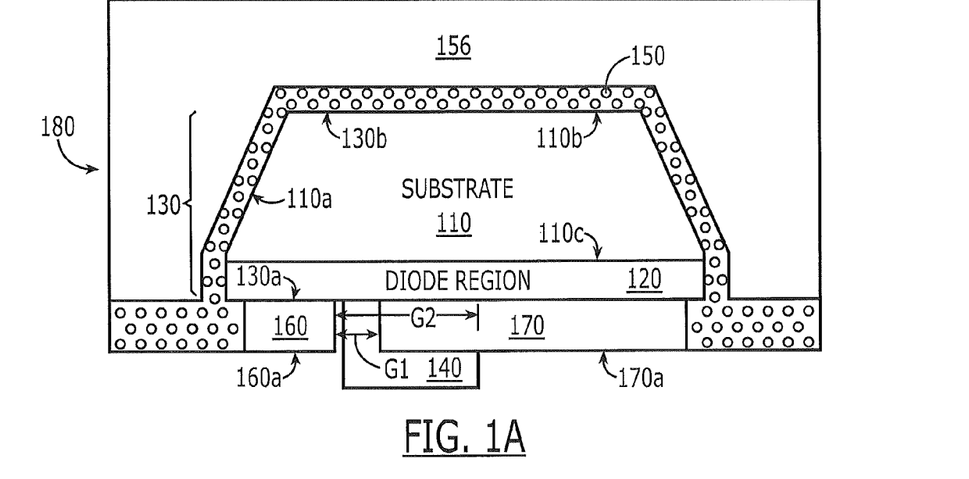
FIGS. 1A and 1B are cross-sectional views of light emitting devices including a solder mask, according to various embodiments described herein.

FIG. 1A is a cross-sectional view of a light emitting device according to various embodiments described herein. Referring now to FIG. 1A, the light emitting device 180 includes a Light Emitting Diode (LED) chip 130 having first and second opposing faces 130a and 130b, respectively. The LED chip 130 includes a diode region 120 that includes therein an n-type layer and a p-type layer. Other layers or regions may also be provided in the diode region 120, which may include quantum wells, buffer layers, etc., that need not be described herein. Moreover, the n-type layer and the p-type layer may be adjacent one another to form a p-n junction or may be spaced apart from one another. Either or both layers may be at the surface of the diode region 120, or may be buried within the diode region 120. The diode region 120 may also be referred to herein as an "LED epi region", because it is typically formed epitaxially on a substrate. For example, a Group III-nitride based LED epi 120 may be formed on a silicon carbide growth substrate. In some embodiments, the growth substrate may be present in the finished product. In other embodiments, the growth substrate may be removed. In still other embodiments, another substrate may be provided that is different from the growth substrate, and the other substrate may be bonded to the LED epi region after removing the growth substrate.

As also shown in FIG. 1A, a transparent substrate 110, such as a transparent silicon carbide growth substrate or a transparent sapphire growth substrate, is provided on the diode region 120. As used herein, a layer or region of an LED is considered to be "transparent" when at least 50% of the radiation from the LED that impinges on the transparent layer or region emerges through the transparent region. The transparent substrate 110 may include a sidewall 110a and may also include a first (inner) face 110c adjacent the diode region 120 and a second (outer) face 110b remote from the first face 110c. In some embodiments, the second face 110b is of smaller area than the first face 110c. Moreover, in some embodiments, the sidewall 110a may be stepped, beveled and/or faceted, so as to provide the second face 110b that is of smaller area than the first face 110c. In other embodiments, the sidewall 110a is an oblique sidewall that extends at an oblique angle from the second face 110b to the first face 110c. Non-oblique sidewalls and approximately equal size faces may be also be provided in other embodiments.

Still referring to FIG. 1A, an anode contact 160 ohmically contacts the p-type layer and extends on the first face 130a of the LED chip 130. A cathode contact 170 ohmically contacts the n-type layer and also extends on the first face 130a of the LED chip 130. The anode and cathode contacts may directly ohmically contact the n-type layer and the p-type layer, respectively, or may ohmically contact these layers by way of one or more conductive vias and/or other intermediate layers. Moreover, as illustrated in FIG. 1A, the anode contact 160 and the cathode contact that both extend on the first face 130a are approximately coplanar. As also shown in FIG. 1A, the anode contact 160 and the cathode contact 170 are spaced apart from one another on the first face 130a, to define a first gap G1 therebetween. Moreover, the anode and cathode contacts 160 and 170, respectively, have outer faces 160a, 170a, respectively, that are remote from the first face 130a of the LED chip, and that may be approximately coplanar in some embodiments The anode and cathode contacts 160 and 170 may be less than about 10 µm thick in some embodiments and may be less than about 5 µm thick in other embodiments.

Figure 6:
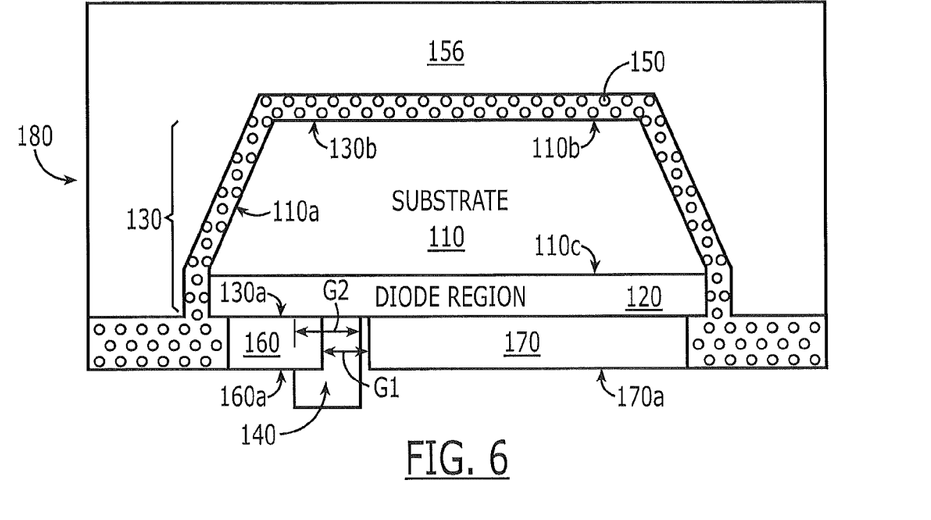
FIGS. 6-10 are cross-sectional views of light emitting devices including a solder mask, according to various embodiments described herein.
Figure 7:
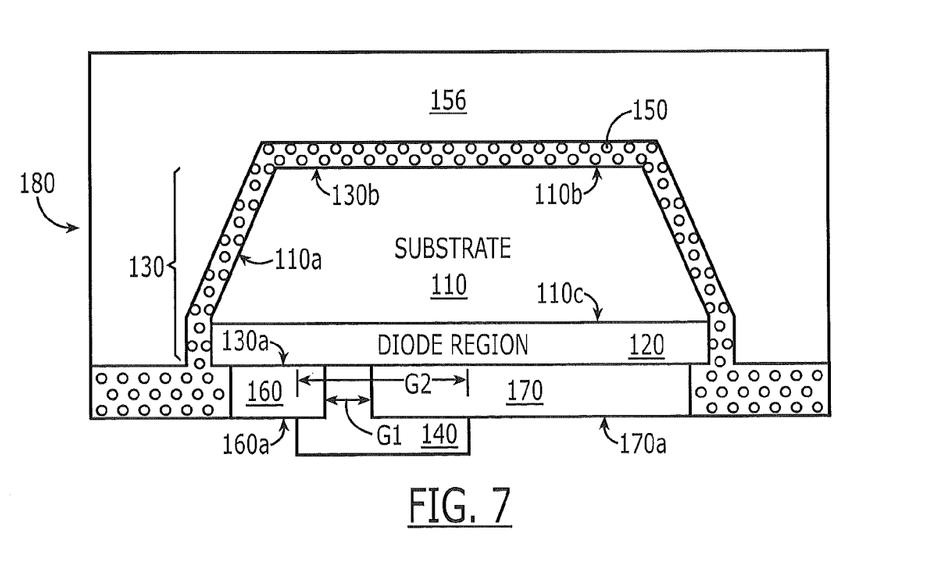

Still referring to FIG. 1A, a solder mask 140 extends from the first gap G1 onto the outer face 160a of the anode contact and/or onto the outer face 170a of the cathode contact 170. In FIG. 1A, the cathode contact 170 is wider than the anode contact 160, and the solder mask 140 extends only onto the outer face 170a of the contact 170, but does not extend onto the outer face 160a of the anode contact 160. In other embodiments, regardless of the relative widths of the anode and cathode contacts 160 and 170, respectively, the solder mask may extend only onto the outer face 160a of the anode contact but not onto the outer face 170a of the cathode contact 170 as illustrated in FIG. 6, or may extend onto the outer face 160a of the anode contact 160 and the outer face 170a of the cathode contact 170 as illustrated in FIG. 7.

As shown in FIG. 1A, the solder mask 140 on the outer face 160a of the anode contact 160 and/or the outer face 170a of the cathode contact 170 protrudes from the first face 130a of the LED chip 130 beyond the outer faces 160a, 170a of the anode contact and the cathode contact 160, 170. Moreover, as also shown in FIG. 1A, the solder mask 140 exposes at least a portion of the outer faces 160a, 170a of the anode and the cathode contacts 160, 170, to define a second gap G2 between the outer faces 160a, 170a of the anode and cathode contacts 160, 170 that are exposed by the solder mask 140. The second gap G2 is wider than the first gap G1 between the anode contact 160 and the cathode contact 170.

The solder mask 140 may comprise any material that is generally used in microelectronic manufacturing to physically and electrical insulate those portions of the circuit to which no solder or soldering is desired. Solder masks may include thermally cured screen-printed masks, dry film and/or screen-applied or curtain-coated liquid photoimageable solder masks. In some embodiments, the solder mask may comprise a conventional photoresist, or any other material that is non-wettable to solder. The solder mask 140 may be less than about 30 µm thick in some embodiments, less than about 5 µm thick in other embodiments, and may be about 1

μm thick or less in still other embodiments. A wide range of thicknesses and materials may be used, as long as effective solder masking takes place.

Moreover, in other embodiments, the solder mask 140 may also include virtually any non-metallic coating, such as silicon dioxide and/or silicon nitride, which may be deposited by physical and/or chemical deposition techniques. In still other embodiments, the solder mask 140 may be reflective, so as to reflect optical radiation that emerges from the diode region 120, back into the diode region 120. Examples of such reflective layers include a dielectric mirror, a white reflective layer, such as a titania-filled layer, and/or other white/reflective layer.

Still referring to FIG. 1A, a phosphor layer 150 is provided on the second face 130b of the LED chip 130. As shown in FIG. 1A, the phosphor layer 150 may also extend onto the sidewall 110a of the substrate, onto the sidewall of the diode region 120, onto the sidewall of the anode contact 160, onto the sidewall of the cathode contact 170 and/or beyond the anode and cathode contacts 160 and 170. In some embodiments, the phosphor layer 150 is a conformal phosphor layer that may be less than about 150 μm thick in some embodiments, less than about 100 μm thick in other embodiments and less than about 50 μm thick in yet other embodiments. It will be understood that the term "phosphor" is used herein to denote any wavelength conversion material, and may be provided according to various configurations.

Figure 8:
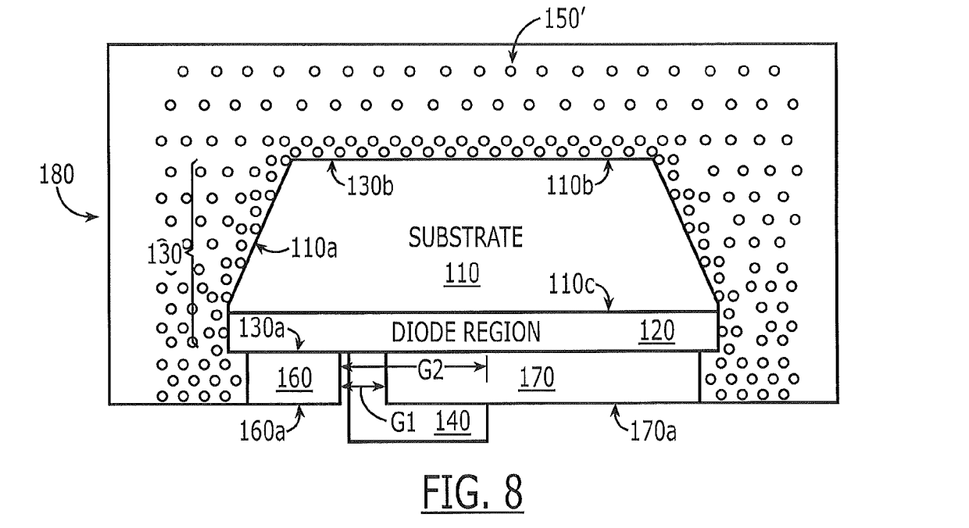

Various techniques may be used to apply the phosphor layer 150, including dispensing, screen printing, film transfer, spraying, coating and/or other techniques. Phosphor preforms also may be applied. In some embodiments, the phosphor layer 150 may comprise silicone and/or other transparent material having phosphor particles therein. It will also be understood that the phosphor layer 150 is shown in FIG. 1A to be coplanar with the outer faces 160a, 170a of the anode and cathode contacts 160 and 170, respectively. However, the phosphor layer 150 need not be coplanar with these outer faces. Specifically, it can be recessed from these outer faces 160a and 170a or may protrude beyond these outer faces 160a and 170a. Moreover, FIG. 1A illustrates the phosphor layer 150 as a thin conformal layer having uniform phosphor particle density. However, as shown in FIG. 8, a phosphor layer 150' may be provided that comprises phosphor particles that are non-uniformly dispersed therein, and that, in some embodiments, may include a phosphor-free region at the exterior surfaces of the phosphor layer 150'. Moreover, the phosphor layer 150' may also be configured as a conformal layer.

In some embodiments, the diode region 120 is configured to emit blue light, for example light having a dominant wavelength of about 450-460 nm, and the phosphor layer 150 comprises yellow phosphor, such as YAG:Ce phosphor, having a peak wavelength of about 550 nm. In other embodiments, the diode region 120 is configured to emit blue light upon energization thereof, and the phosphor layer 150 may comprise a mixture of yellow phosphor and red phosphor, such CASN-based phosphor. In still other embodiments, the diode region 120 is configured to emit blue light upon energization thereof, and the phosphor layer 150 may comprise a mixture of yellow phosphor, red phosphor and green phosphor, such as LuAG:Ce phosphor particles. Moreover, various combinations and subcombinations of these and/or other colors and/or types of phosphors may be used in mixtures and/or in separate layers. In still other embodiments, a phosphor layer is not used. For example, a blue, green, amber, red, etc., LED need not use phosphor.

Figure 9:
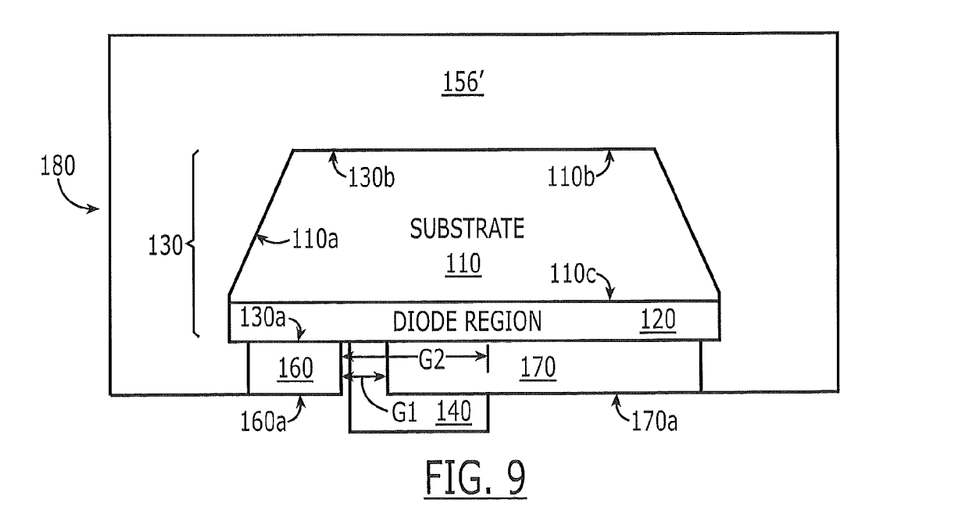

Still referring to FIG. 1A, an outer transparent layer 156, for example, comprising silicone without phosphor particles therein, may also be provided to provide a primary optic for the light emitting device 180. The transparent layer 156 that is free of phosphor may be shaped to provide a lens, dome and/or other optical component, so that the sides and/or tops thereof may be oblique to the diode region. The transparent layer 156 that is free of phosphor may also encapsulate the phosphor layer 150 and/or light emitting surfaces of the LED chip 130. The transparent layer 156 may be at least 1.5 mm thick in some embodiments, at least 0.5 mm thick in other embodiments, and may not be present in still other embodiments. Thus, in other embodiments, a transparent layer 156' may be used without a phosphor layer 150. For example, as illustrated in FIG. 9, the transparent layer 156 is directly on the second face 130b of the LED chip 130. In some embodiments, a relatively thick transparent layer 156' may be used, as illustrated in FIG. 9. In other embodiments, a conformal transparent layer may be used. In still other embodiments, the transparent layer 156' of FIG. 9 may be provided on the phosphor layer 150' of FIG. 8 that comprises phosphor particles that are non-uniformly dispersed therein.

Figure 1B:
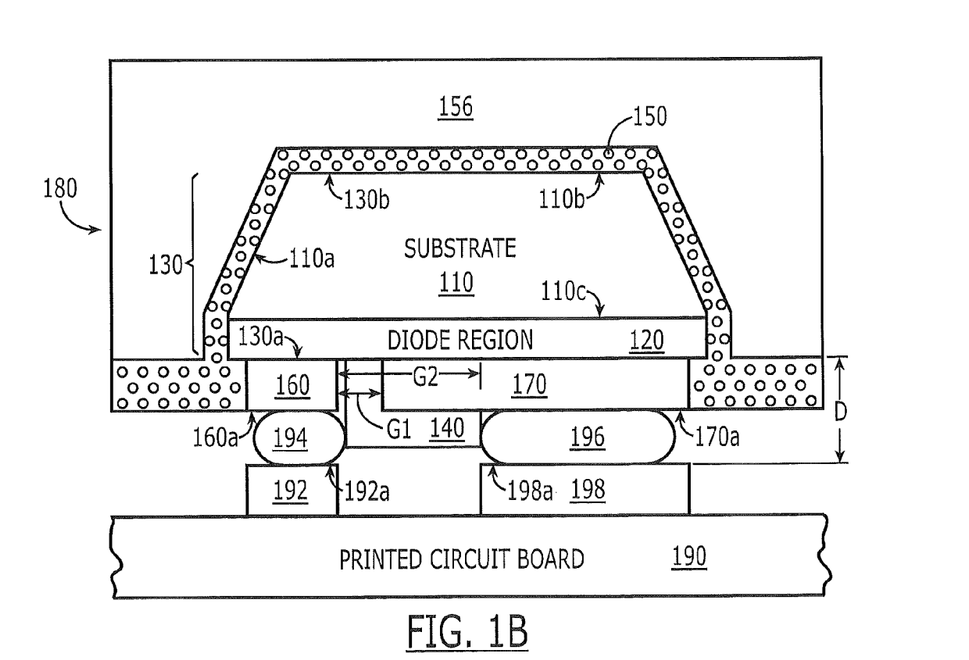

FIG. 1B is a cross-sectional view of a light emitting device 180 of FIG. 1A that is combined with a printed circuit board 190, wherein the diode region 120 faces the printed circuit board 190 and is connected to the printed circuit board 190 without an intervening submount or interposer between the diode region 120 and the printed circuit board 190. The printed circuit board 190 may include any conventional printed circuit board material that is used to mechanically support and electrically connect electronic components using conductive pathways, tracks or signal traces. The printed circuit board 190 may comprise laminate, copper-clad laminates, resin-impregnated B-stage cloth, copper foil, metal clad printed circuit boards and/or other conventional printed circuit boards. In some embodiments, the printed circuit board 190 is used for surface mounting of electronic components thereon. The printed circuit board 190 may include multiple light emitting devices 180 thereon, as well as one or more integrated circuit chip power supplies, integrated circuit chip LED controllers and/or other discrete and/or integrated circuit passive and/or active microelectronic components, such as surface mount components thereon.

The printed circuit board 190 may include an anode pad 192 and a cathode pad 198. The anode pad 192 and cathode pad 198 provide a connection surface 192a, 198a of the printed circuit board 190. A first solder layer 194 electrically and mechanically connects, and in some embodiments directly connects, the exposed surface 160a of the anode contact 160 to the anode pad 192. A second solder layer 196 electrically and mechanically connects, and in some embodiments directly connects, the exposed surface 170a of the cathode contact 170 to the cathode pad 198. The solder layers 194, 196 may comprise eutectic gold/tin solder, in solder bump, solder paste and/or solder preform form, and may also include other solder compositions, such as lead/tin solders, tin/silver/copper solders, known as "SAC" solder and/or other solder configurations. In still other embodiments, direct attachment of the anode contact 160 to the anode pad 192, and direct attachment of the cathode contact 170 to the cathode pad 198, may be provided, for example using thermo-compression bonding and/or other techniques.

In embodiments of FIG. 1B, the LED chip 130 is configured to electrically connect the diode region 120 to the printed circuit board 190 without an intervening submount between the diode region 120 and the printed circuit board 190. Moreover, in some embodiments, the diode region 120 may be spaced apart from the connection surface 192a, 198a, by a distance D. Since there is no submount or interposer between the connection surface 192a, 198a and the diode region 120, the distance D may be less than about 200 µm in some embodiments, less than about 150 µm in other embodiments, and less than about 100 µm in yet other embodiments.

Additional discussion of various embodiments of FIGS. 1A and 1B will now be provided. Specifically, the LED chip 130 of FIGS. 1A and 1B may correspond to the DA3547, DA700 and/or DA1000 LED chips marketed by Cree, Inc., and described in the respective Data Sheets entitled *"Direct Attach DA3547™ LEDs"* (Data Sheet: CPR3EL Rev. A, 2010), *"Direct Attach DA700™ LEDs"* (Data Sheet: CPR3EU Rev.—, 2011) and *"Direct Attach DA1000™ LEDs"* (Data Sheet: CPR3ES Rev. A, 2010), the disclosures of which are hereby incorporated herein by reference in their entirety as if set forth fully herein, except that the LED chip 130 does not include a submount or interposer. The LED chip 130 may also correspond to LED chips described in U.S. Application Publication No. 2012/0193661 to Emerson et al., entitled *Gap Engineering for Flip-Chip Mounted Horizontal LEDs*, published Aug. 2, 2012, the disclosure of which is hereby incorporated herein by reference in its entirety as if set forth fully herein, except that a submount or interposer is not included.

Figure 10:
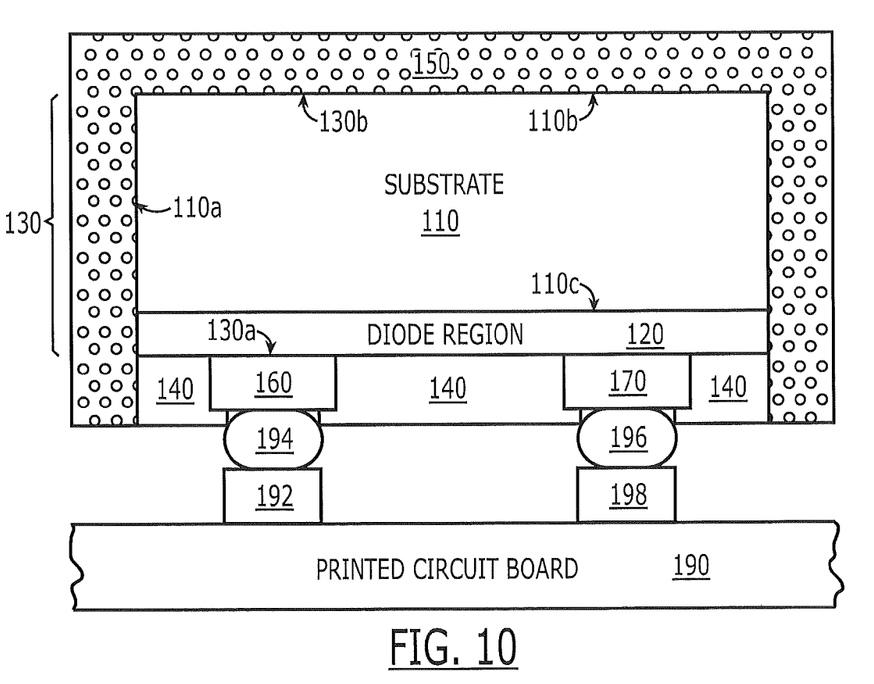

Other LED configurations may be used in other embodiments. For example, FIG. 10 illustrates an LED chip 130 that includes a substrate 110, such as a silicon carbide, sapphire and/or other substrate, having substrate sidewalls 110a that are orthogonal to the first (inner) face 110c. The anode and cathode contacts 160, 170 may have different geometries than illustrated in FIGS. 1A and 1B, as long as the anode and cathode contacts 160 are on a single face 130a of the LED chip 130. A phosphor layer 150 may be provided in some embodiments as illustrated in FIG. 10, and/or a transparent layer (not shown) may also be provided in some embodiments. The solder mask 140 may extend on the entire first face 130a of the LED chip 130, and may define openings that expose at least some of the anode and cathode contacts 160 and 170, respectively. The solder mask 140 may be embodied by any of the materials described above, including photoresist, dielectric mirror, white solder mask, titania-filled layers and/or other white and/or reflective layers.

Embodiments of FIGS. 1A and 1B can use a solder mask 140 to provide a larger second gap G2 than the first gap G1 that is provided by the LED chip 130 itself, without the need to change the design of the LED chip 130, without the need for a submount or interposer. Moreover, the anode and cathode contacts 160, 170 need not protrude beyond the phosphor layer 150, as long as enough solder 194, 196 is used to contact and wet the contact metals. Similarly, the solder mask 140 can protrude beyond the anode and cathode contacts 160 and 170, as long as enough solder is used to contact and wet the contact metals. The light emitting device 180 can provide an LED component that can be used effectively with surface mount technology on printed circuit boards, without the need for a submount or interposer. Lower cost, simplified manufacturing and/or higher performance may thereby be provided.

Figure 2A:
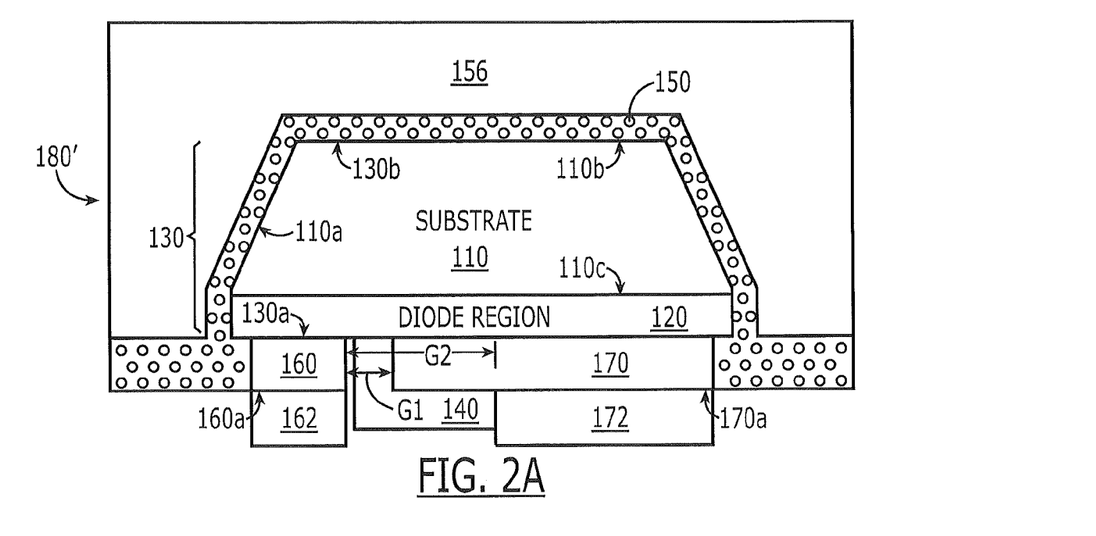
FIGS. 2A and 2B are cross-sectional views of light emitting devices including a solder mask and contact extensions, according to various embodiments described herein.
Figure 2B:
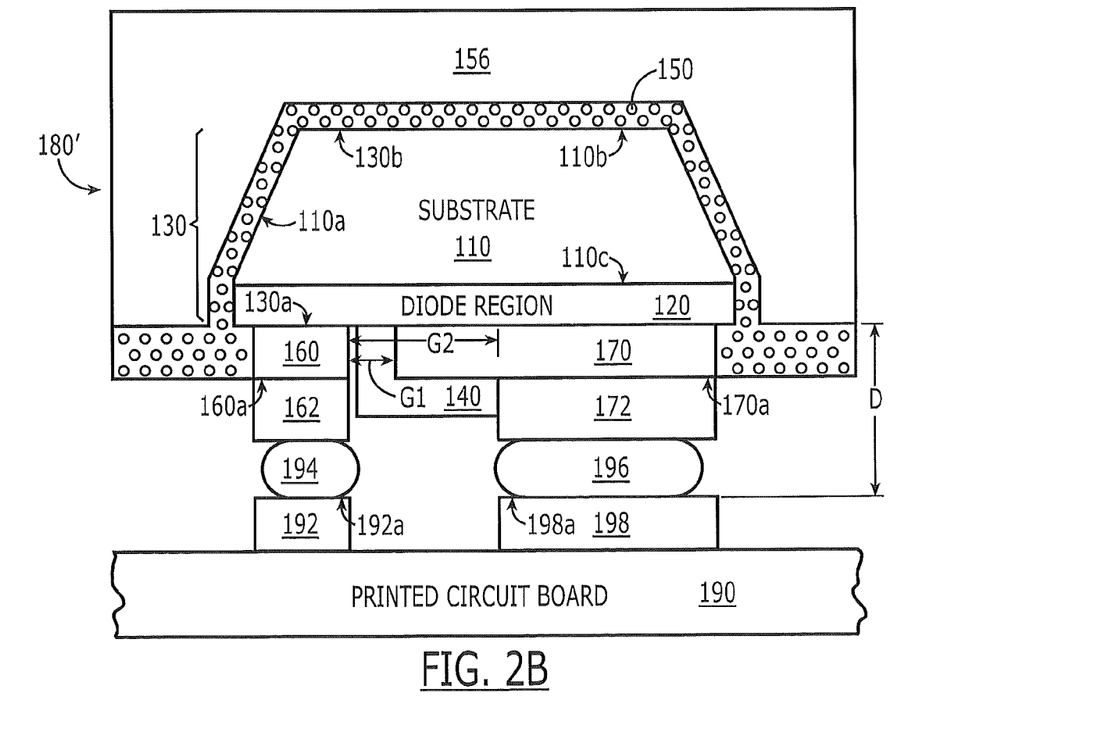

FIGS. 2A and 2B are cross-sectional views of light emitting devices 180' according to various other embodiments described herein. FIGS. 2A and 2B correspond to FIGS. 1A and 1B, respectively, except that the light emitting devices 180' of FIGS. 2A and 2B add an anode contact extension 162 and a cathode contact extension 172 on the respective outer faces 160a, 170a of the anode and cathode contacts 160, 170, respectively, that are exposed by the solder mask 140. Thus, although the outer surfaces of the light emitting device 180 of FIGS. 1A and 1B are not coplanar, the outer surfaces may be made coplanar, as shown in FIGS. 2A and 2B, by adding the anode and cathode contact extensions 162 and 172, respectively. The anode and cathode contact extensions 162 and 172 may be fabricated by plating and/or other techniques. Moreover, outer surfaces of the anode and cathode contact extensions 162, 172 need not be coplanar with the outer surface of the solder mask 140, as illustrated in FIG. 2B.

Figure 3A:
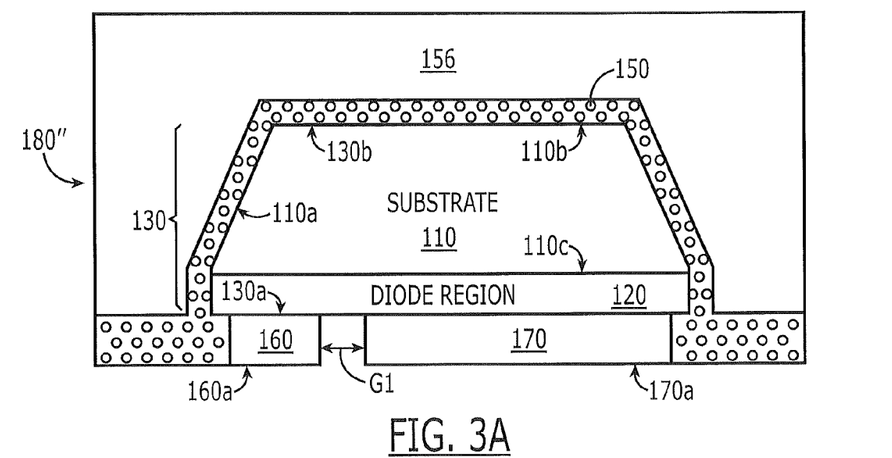
FIGS. 3A and 3B are cross-sectional views of light emitting devices without a solder mask or contact extensions, according to various embodiments described herein.
Figure 3B:
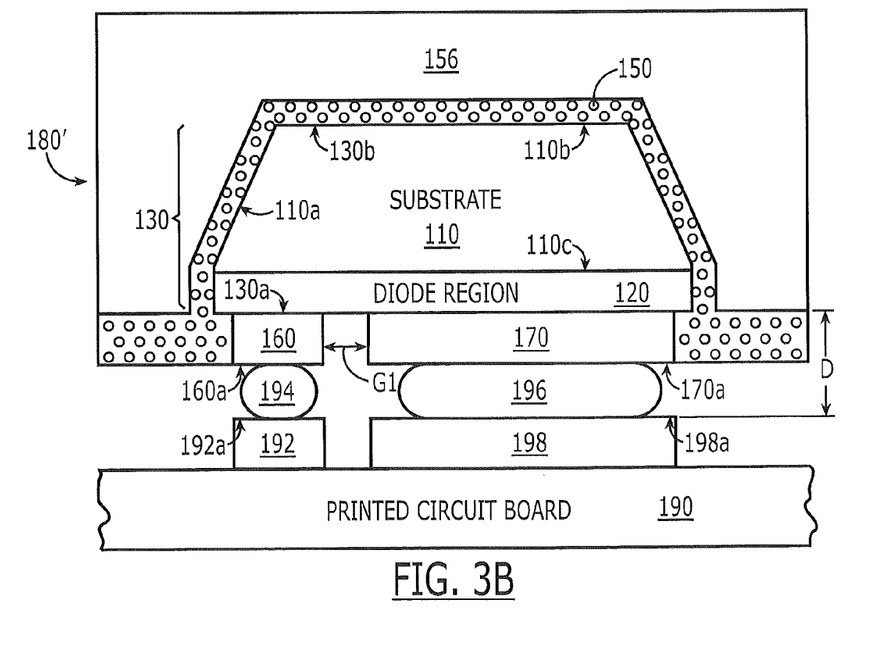

FIGS. 3A and 3B are cross-sectional views of light emitting devices 180" according to still other embodiments described herein. FIGS. 3A and 3B correspond to FIGS. 1A and 1B, except that a solder mask 140 is not used. More specifically, as shown in FIGS. 3A and 3B, the size of the first gap G1, the configuration of the anode and cathode contacts 170, 170, the configuration of the solder layers 194, 196, the configuration of the anode and cathode pads 192, 198, and/or other configurations, may be used to electrically connect the diode region 120 to the printed circuit board 190 so that the diode region 120 faces the printed circuit board 190, without an intervening submount between the diode region 120 and the printed circuit board 190. Thus, by properly designing the geometry and/or configuration of the anode and cathode contacts 160, 170, the geometry and/or configuration of the anode and cathode pads 192, 198 and/or the geometry, configuration and/or composition of the solder layers 194, 196, the diode region 120 can be electrically and mechanically connected to the printed circuit board 190 without an intervening submount therebetween. A submount-free LED component may thereby be provided.

FIGS. 4A-4G are cross-sectional views of light emitting devices according to various embodiments described herein, during intermediate fabrication thereof. FIGS. 4A-4G illustrate fabrication of LED devices according to FIGS. 1A, 1B, 2A and 2B, as will now be described.

Figure 4A:
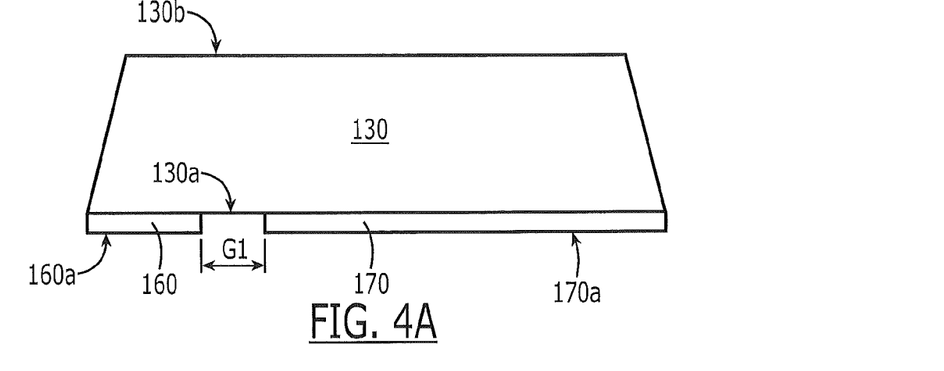
FIGS. 4A-4G are cross-sectional views of light emitting devices during intermediate fabrication thereof, according to various embodiments described herein.

Referring to FIG. 4A, an LED chip 130 is provided having first and second opposing faces 130a, 130b and an anode contact 160 and a cathode contact 170 that are spaced apart from one another on the first face 130a to define a first gap G1 therebetween. The anode and cathode contacts 160, 170 have outer faces 160a, 170a that are remote from the first face 130a.

Figure 4B:
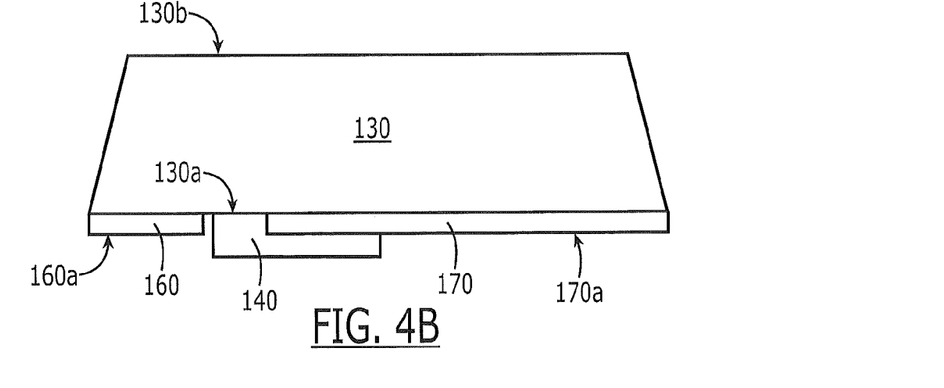

Then, referring to FIG. 4B, the solder mask 140 is formed that extends from the first gap G1 onto the outer face 160a of the anode contact 160 and/or the outer face 170a of the cathode contact 170. The solder mask 140 may be fabricated by blanket coating or depositing a solder mask material, such as a conventional solder mask material, a photoresist or other dielectric material, and then patterning this material, as shown in FIG. 4B. Solder mask preforms may also be used. The solder mask 140 can reduce and/or prevent placement errors during assembly to a printed circuit board.

Figure 4C:
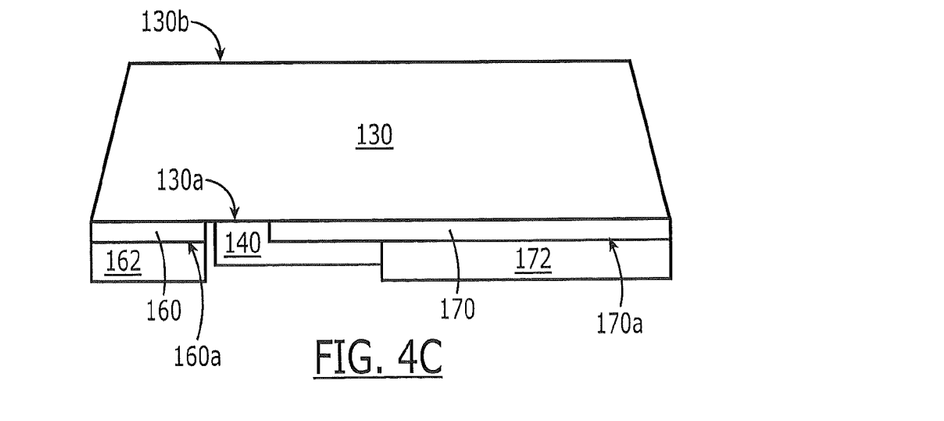

Referring now to FIG. 4C, if desired, anode and cathode contact extensions 162 and 172, respectively, may be added, as was illustrated in FIG. 2A. In other embodiments, for example as was shown in FIG. 1A, these anode and cathode contact extensions 162, 172 are not included, and these extensions will not be shown in FIGS. 4D-4G.

Figure 4D:
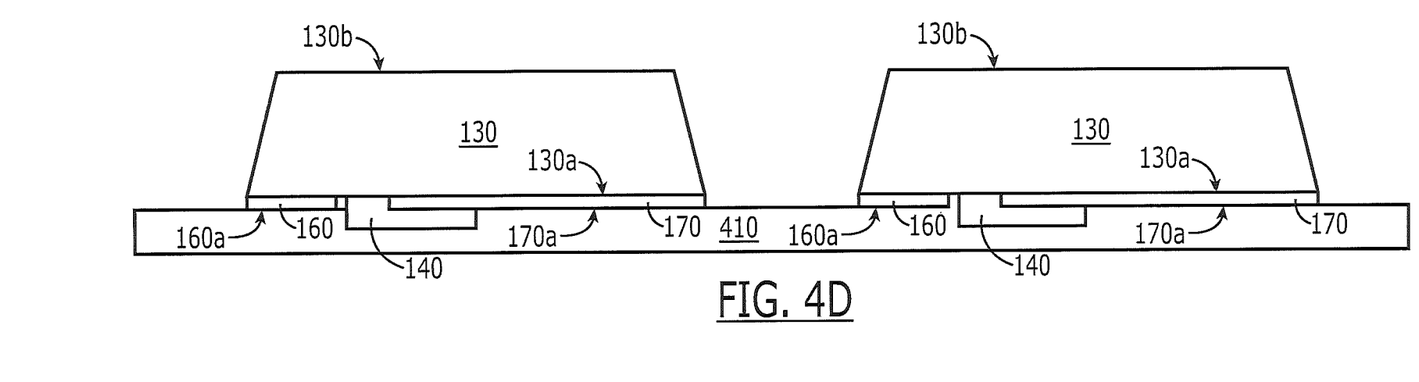

Referring now to FIG. 4D, a plurality of LED chips 130 are then sorted and placed onto a receiving surface, such as a tape 410, such that the anode contact (or extension), the cathode contact (or extension) and the solder mask face the tape 410. The LED chips 130 may be binned or sorted prior to placing them on the tape 410. The sorting may take place to eliminate defective or out-of-specification chips and/or to provide "binning" based on light output.

Figure 4E:
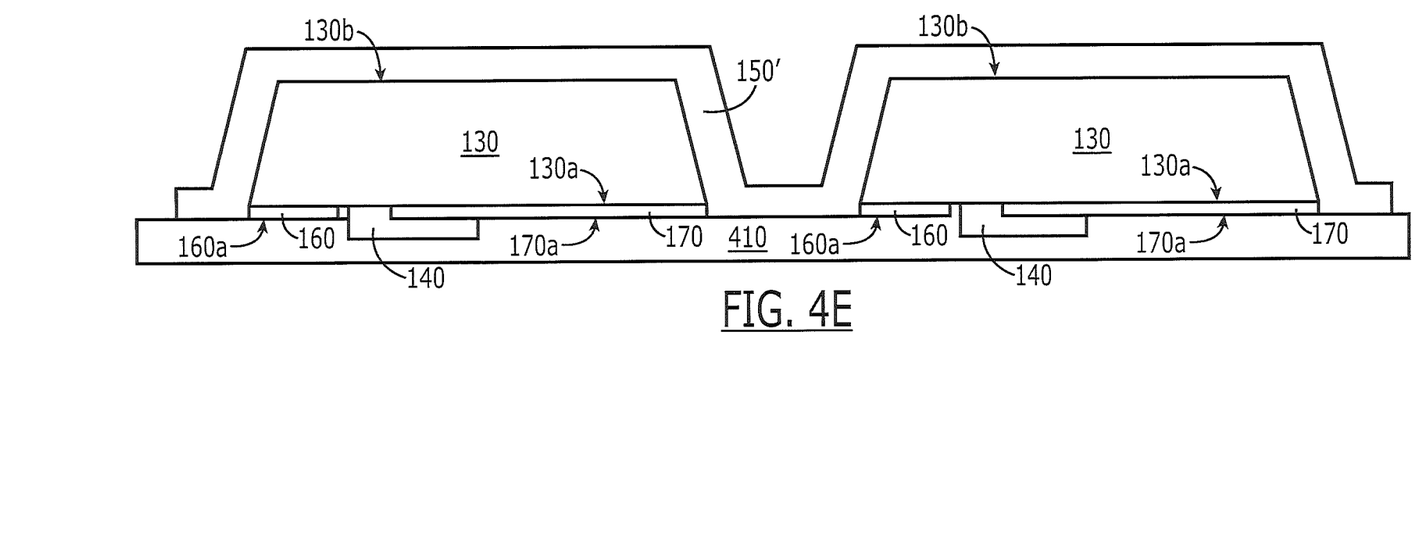

Referring to FIG. 4E, optionally a phosphor layer 150' is then blanket formed on the second face 130b of the LED chip 130. As shown in FIG. 4E, a conformal phosphor layer may be formed by blanket coating or depositing a silicone layer including phosphor particles therein on the exposed surface of the LED chip 130 and on the tape 410 therebetween. The phosphor layer 150' may be formed using many techniques including pressing a precast sheet. The pressing may be performed by a vacuum bag and/or other technique. In other embodiments, the phosphor layer 150' may be formed on the LED chip 130 prior to placement on the tape 410.

Figure 4F:
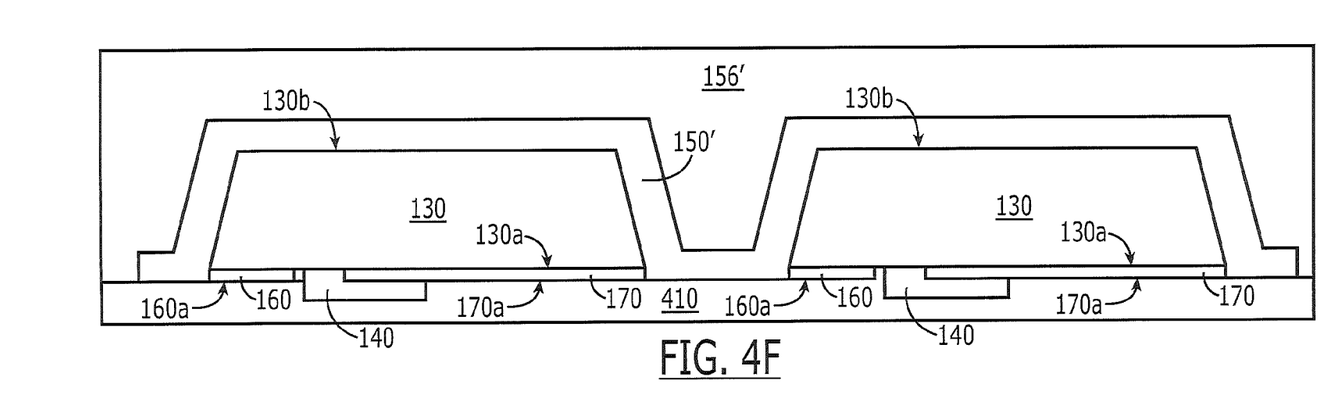

Then, referring to FIG. 4F, optionally a blanket layer of clear silicone 156' is added, for example by dispensing and/or by using another precast sheet. In other embodiments, the phosphor layer 150' and the transparent layer 156' may be formed using one step. For example, a liquid silicone coating including phosphor particles therein may be blanket coated on the LED chip 130 and on the tape 410, and the phosphor particles may be allowed to settle under the effect of gravity, to provide a higher concentration of phosphor particles adjacent the LED chip 130, and a lower connection or no phosphor particles remote from the LED chip 130. In other embodiments, however, two separate operations are performed as was shown in FIGS. 4E and 4F, which may reduce the stress in the layers. In still other operations, the phosphor layer 150' and/or the transparent layer 156' may be omitted.

Figure 4G:
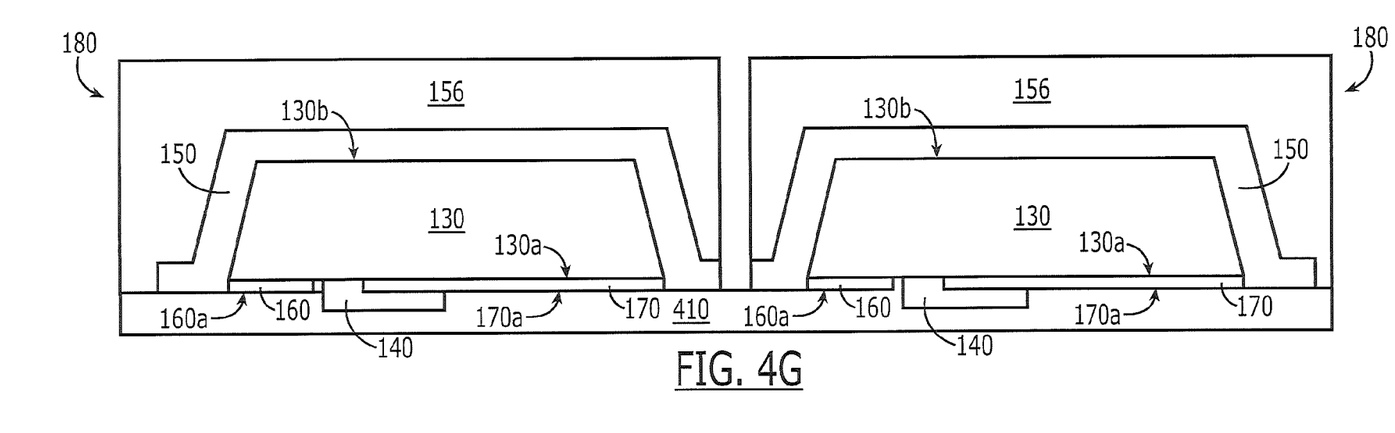

Referring now to FIG. 4G, the light emitting devices 180 are then singulated, for example using a roller knife, and the tape 410 is then stretched to separate the singulated devices on the tape 410. The tape 410 may be used for distribution of the LEDs to customers who perform mounting on a printed circuit board. The light emitting devices are then soldered to a printed circuit board, as was illustrated in FIGS. 1B and/or 2B. In some embodiments, the light emitting devices 180 of FIG. 4G may be soldered onto a printed circuit board 190, as shown in FIG. 1B or 2B, directly from the tape 410. Specifically, there may not be a need to again sort the devices 180, as the phosphor tape cast or other receiving surface can be quite accurate and/or pre-screened. Alternatively, the light emitting devices 180 may be removed from the receiving surface, such as tape 410, sorted, and then applied to another tape or other temporary transfer surface prior to soldering onto the printed circuit board 190.

FIGS. 5A-5E are cross-sections of light emitting devices according to various other embodiments described herein during intermediate fabrication thereof, to provide the devices of FIGS. 3A and 3B. Specifically, referring to FIG. 5A, an LED chip 130 is provided as was described in connection with FIG. 4A. However, in contrast with FIGS. 4B and 4C, a solder mask and contact extensions are not formed.

Figure 5A:
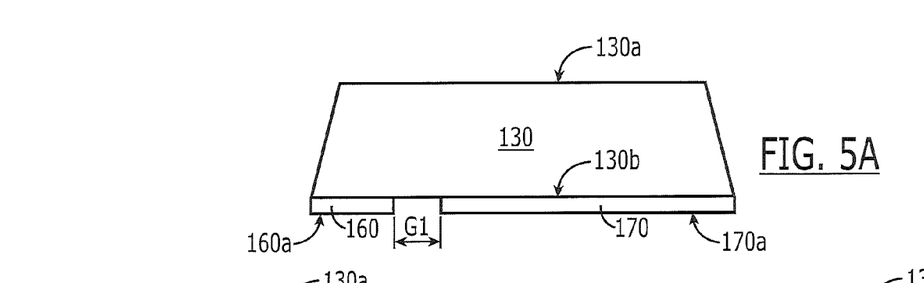
FIGS. 5A-5E are cross-sectional views of light emitting devices during intermediate fabrication thereof, according to various other embodiments described herein.
Figure 5B:
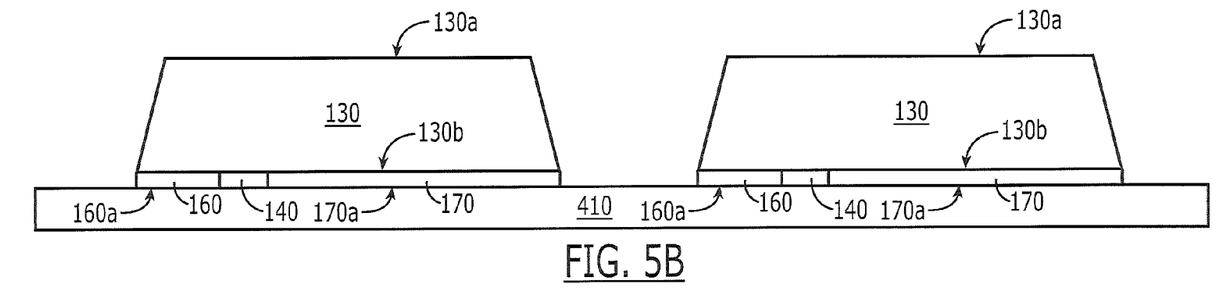
Figure 5C:
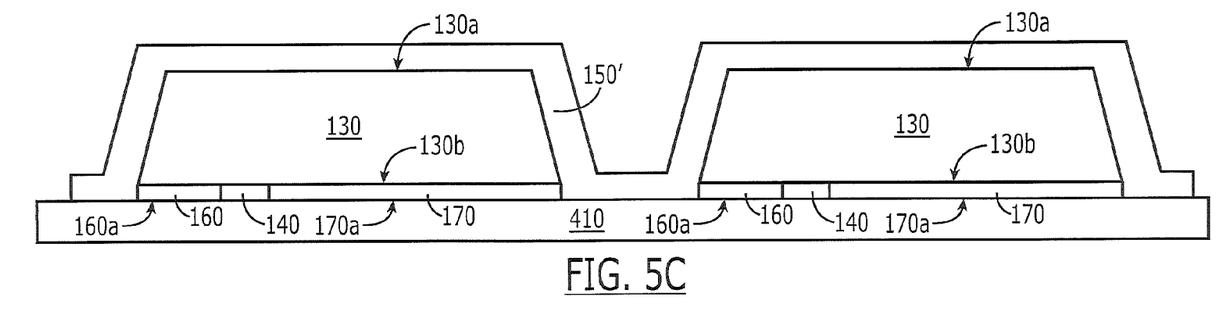
Figures 5D, 5E:
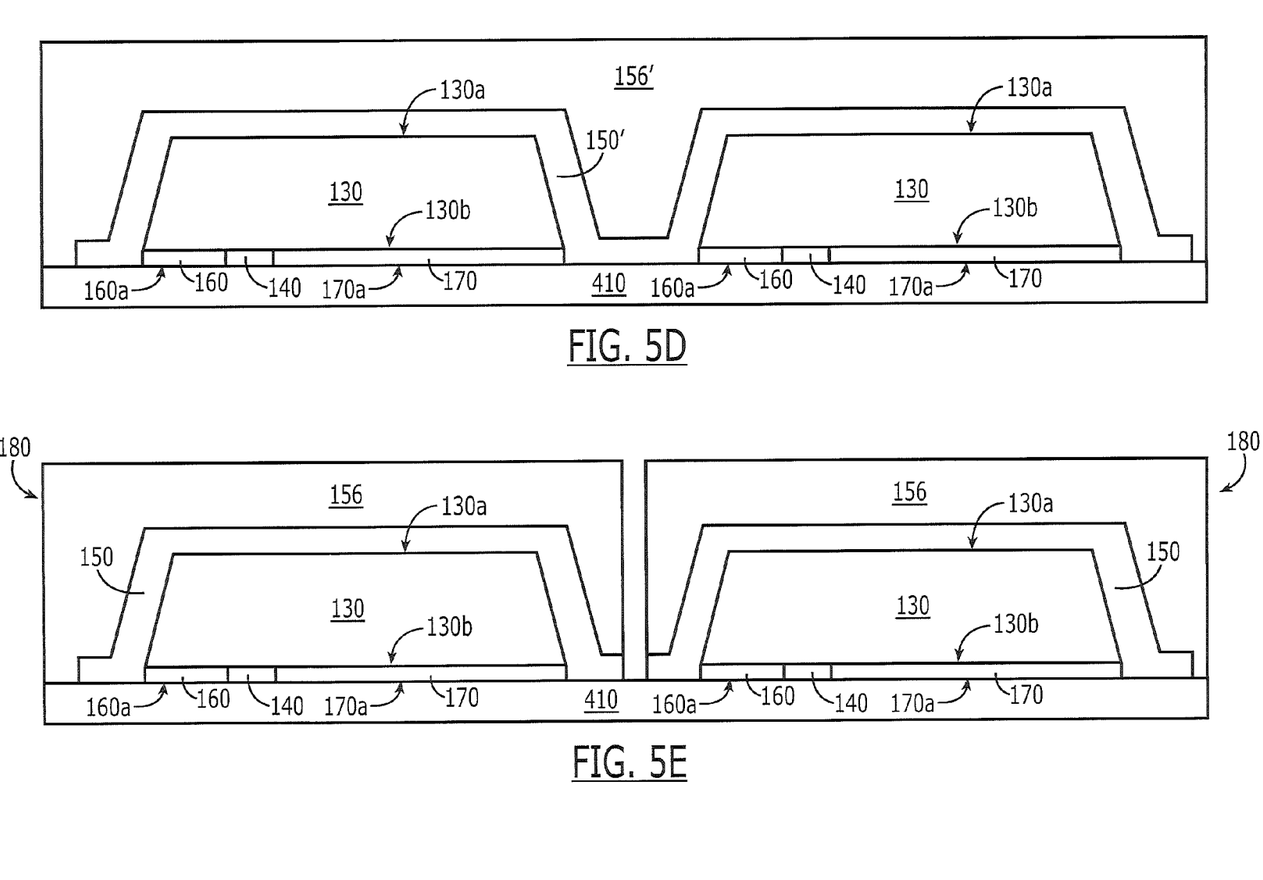

Referring to FIG. 5B, a plurality of LED chips 180 are mounted on a receiving surface, such as a tape 410, as was described in connection with FIG. 4D. In FIG. 5C, optionally a phosphor layer 150' is applied, as was described in connection with FIG. 4E. In FIG. 5D, optionally a transparent layer 156' that is free of phosphor is applied, as was described in connection with FIG. 4F. In FIG. 5E, singulation and tape stretching takes place, as was described in connection with FIG. 4G. The devices are then placed on a printed circuit board, as was described in connection with FIG. 3B. Note that coplanarity of the LED surfaces is not required, as the solder can be thick enough to wet the contact surfaces.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting device comprising:
  a Light Emitting Diode (LED) chip having first and second opposing faces;
  an anode contact and a cathode contact that are spaced apart from one another on the first face to define a gap therebetween, the anode and cathode contacts having outer faces that are remote from the first face;
  a layer that extends from the gap onto the outer face of the cathode contact, the layer having a first face adjacent the outer face of the cathode contact, and a second face remote from the outer face of the cathode contact; and
  a first solder layer on the outer face of the anode contact and a second solder layer on the outer face of the cathode contact that are spaced apart from one another by the layer that extends onto the outer face of the cathode contact, wherein the first and second solder layers extend closer to the first face of the LED chip than the second face of the layer,
  wherein the cathode contact is wider than the anode contact and wherein the layer extends from the gap onto the outer face of the cathode contact, but does not extend onto the outer face of the anode contact.

2. A light emitting device according to claim 1 wherein the outer faces of the anode and cathode contacts are coplanar.

3. A light emitting device according to claim 1 wherein the layer on the outer face of the cathode contact protrudes from the first face of the LED chip beyond the outer faces of the anode and cathode contacts.

4. A light emitting device according to claim 1 wherein the gap is a first gap and wherein the layer exposes at least a portion of the outer faces of the anode and cathode contacts to define a second gap between the outer faces of the anode and cathode contacts that are exposed by the layer and that is wider than the first gap between the anode and cathode contacts.

5. A light emitting device according to claim 1 further comprising a phosphor layer on the second face of the LED chip.

6. A light emitting device according to claim 5 further comprising a transparent layer that is free of phosphor, on the phosphor layer and remote from the second face of the LED chip.

7. A light emitting device according to claim 5 wherein the phosphor layer comprises phosphor particles that are non-uniformly dispersed therein.

8. A light emitting device according to claim 5 wherein the phosphor layer is also on a sidewall of the LED chip that is between the first and second faces.

9. A light emitting device according to claim 1 further comprising a transparent layer on the second face of the LED chip.

10. A light emitting device comprising:
  a Light Emitting Diode (LED) chip having first and second opposing faces;
  an anode contact and a cathode contact that are spaced apart from one another on the first face to define a gap therebetween, the anode and cathode contacts having outer faces that are remote from the first face;

a layer that extends from the gap onto the outer face of the anode contact and/or the outer face of the cathode contact, the layer having a first face adjacent the outer face of the anode contact and/or the outer face of the cathode contact, and a second face remote from the outer face of the anode contact and/or the outer face of the cathode contact; and a receiving surface directly on the outer faces of the anode and cathode contacts and directly on the layer.

11. A light emitting device comprising:
a Light Emitting Diode (LED) chip having first and second opposing faces;
an anode contact and a cathode contact that are spaced apart from one another on the first face to define a gap therebetween, the anode and cathode contacts having outer faces that are remote from the first face;
a layer that extends from the gap onto the outer face of the anode contact and/or the outer face of the cathode contact, the layer having a first face adjacent the outer face of the anode contact and/or the outer face of the cathode contact, and a second face remote from the outer face of the anode contact and/or the outer face of the cathode contact; and
a first solder layer on the outer face of the anode contact and a second solder layer on the outer face of the cathode contact that are spaced apart from one another by the layer that extends onto the outer face of the anode contact and/or the cathode contact, wherein the first and second solder layers extend closer to the first face of the LED chip than the second face of the layer,
wherein the layer comprises reflecting material.

12. A method of fabricating a light emitting device comprising:
providing a Light Emitting Diode (LED) chip having first and second opposing faces and an anode contact and a cathode contact that are spaced apart from one another on the first face to define a gap therebetween, the anode and cathode contacts having outer faces that are remote from the first face;
forming a layer that extends from the gap onto the outer face of the anode contact and/or the outer face of the cathode contact, the layer having a first face adjacent the outer face of the anode contact and/or the outer face of the cathode contact, and a second face remote from the outer face of the anode contact and/or the outer face of the cathode contact; and
placing the LED chip on a receiving surface such that the outer faces of the anode contact, the cathode contact and the layer are directly on the receiving surface.

13. A method according to claim 12 further comprising:
forming a phosphor layer on the second face of the LED chip after the LED chip is placed on the receiving surface.

14. A method according to claim 13 further comprising:
forming a transparent layer that is free of phosphor, on the phosphor layer.

15. A method according to claim 13 wherein the phosphor layer comprises phosphor particles that are non-uniformly dispersed therein.

16. A method according to claim 13 further comprising:
removing the receiving surface from the LED chip having the phosphor layer thereon.

17. A method according to claim 16 further comprising:
soldering the outer faces of the anode and cathode contacts to a printed circuit board.

18. A method according to claim 12 wherein the outer faces of the anode and cathode contacts are coplanar.

19. A light emitting device according to claim 11 further comprising a phosphor layer on the second face.

20. A light emitting device according to claim 19 further comprising a transparent layer that is free of phosphor, on the phosphor layer remote from the second face.

21. A light emitting device according to claim 19 wherein the phosphor layer comprises phosphor particles that are non-uniformly dispersed therein.

22. A light emitting device according to claim 19 wherein the phosphor layer is also on a sidewall of the LED chip that is between the first and second faces.

23. A light emitting device according to claim 11 further comprising a transparent layer on the second face of the LED chip.

24. A light emitting device according to claim 1 wherein the layer comprises a white reflective layer.

25. A light emitting device according to claim 1 wherein the layer comprises a screen-printed, dry film, screen-applied or curtain-coated liquid, solder mask.

26. A light emitting device according to claim 1 wherein the layer comprises titania.

27. A light emitting device according to claim 11 wherein the layer comprises a white reflective layer.

28. A light emitting device according to claim 11 wherein the layer comprises a screen-printed, dry film, screen-applied or curtain-coated liquid, solder mask.

29. A light emitting device according to claim 11 wherein the layer comprises titania.

30. A light emitting device according to claim 1 wherein the respective first and second solder layers directly contact respective opposing sidewalls of the layer.

31. A light emitting device according to claim 11 wherein the respective first and second solder layers directly contact respective opposing sidewalls of the layer.

* * * * *